(12) United States Patent
Belverde et al.

(10) Patent No.: US 7,173,801 B2
(45) Date of Patent: Feb. 6, 2007

(54) PROTECTION CIRCUIT FOR FAULTED POWER DEVICES

(75) Inventors: Gaetano Belverde, Buscemi (IT); Maurizio Melito, Aci Castello (IT); Salvatore Musumeci, Fiumefreddo (IT); Rosario Pagano, Riposto (IT); Angelo Raciti, Aci Sant'Antonio (IT)

(73) Assignee: STMicroelectronics S.r.l. (IT)

( * ) Notice: Subject to any disclaimer, the term of this patent is extended or adjusted under 35 U.S.C. 154(b) by 245 days.

(21) Appl. No.: 10/464,812

(22) Filed: Jun. 16, 2003

(65) Prior Publication Data
US 2004/0042139 A1    Mar. 4, 2004

(30) Foreign Application Priority Data
Jun. 14, 2002    (IT)    .......................... MI2002A1321

(51) Int. Cl.
*H02H 3/00*    (2006.01)

(52) U.S. Cl. ..................................... 361/93.1

(58) Field of Classification Search ............... 361/93.1, 361/100
See application file for complete search history.

(56) References Cited

U.S. PATENT DOCUMENTS 5,526,216 A * 6/1996 Konrad et al. ............... 361/101
5,949,273 A * 9/1999 Mourick et al. ............ 327/442

* cited by examiner

*Primary Examiner*—Stephen W. Jackson
(74) *Attorney, Agent, or Firm*—Lisa K. Jogenson; Graybeal Jackson Haley LLP; Paul F. Rusyn

(57) ABSTRACT

A protection circuit for a control terminal of a power device of the type comprising at least one resistive element connected between at least one output terminal of a driver and the control terminal of the power device includes at least one turning-off transistor having its conduction terminals connected to the control terminal of the power device and to at least one output terminal of the driver, respectively. A control terminal is coupled to the control terminal of the power device through a second resistive element.

25 Claims, 4 Drawing Sheets

PROTECTION CIRCUIT FOR FAULTED POWER DEVICES

PRIORITY CLAIM

This application claims priority from Italian patent application No. MI2002A 001321 which was filed on Jun. 14, 2002 and which is incorporated by reference.

TECHNICAL FIELD

The present invention relates generally to a protection device of a power device that has entered a FUL (Fault Under Load) type of faulty operating condition.

More precisely, an embodiment of the invention relates to a protection circuit for a control terminal of a power device, of the type comprising at least one resistive element connected between at least one output terminal of a driver and said control terminal of said power device.

Though not limited to, the invention particularly relates to a protection circuit which is effective to limit the dynamic current peak of a power device obtained by means of an IGBT transistor which has entered a FUL type of faulty operating condition, the description below making reference to this field of application for convenience of illustration only.

BACKGROUND

As it is well known, in such applications as motor control, the power devices employed must be suitable to withstand the energy stress that originates from a short-circuit situation, or more generally, from a fault condition of the system which comprises power devices over a time period that may be on the order of tens of microseconds.

Accordingly, these power devices must be strong throughout this time period in order to give appropriate protection circuits a chance to remove the faulty condition and block the system operation.

Particularly interesting is the "Fault Under Load" (FUL), i.e. short-circuit, occurring during the conductive step during which the power device undergoes high current peaks.

Examples of standard power devices include MOS power transistors and IGBTs. For simplicity, reference will be made hereinafter to a power device obtained by means of an IGBT, and having gate, emitter and collector terminals, the considerations thereon being equally applied to a MOS power transistor and having corresponding gate, drain and source terminals.

FIG. 1 schematically shows a circuit configuration 1 useful for completely testing (FUL TEST) power devices.

In particular, the circuit configuration 1 comprises a first power device $Q_F$, especially an IGBT transistor, connected between a power switch SWITCH and a reference potential GND by means of its collector and emitter terminals, $C_F$, and $E_F$.

The power switch SWITCH is connected in turn between a voltage reference Vbus and the power device $Q_F$, and is parallel connected to an inductive load LOAD.

Under normal operation condition on the inductive load LOAD, the power switch SWITCH is turned on to short-circuit the inductive load LOAD and raise the collector voltage $C_F$ of the power device $Q_F$ to the level of the voltage Vbus.

It should be noted that the power device $Q_F$ has a capacitance $C_{GC}$, known as Miller capacitance, connected between the collector terminal $C_F$ and a gate terminal A, as well as a gate capacitance $C_{GE}$ connected between the gate terminal A and the emitter terminal $E_F$.

Consider the following comprehensive relation:

$$i = C \cdot \frac{dV}{dt} \quad (1)$$

where i is the current flowing through a capacitance C, and dV/dt is the timing voltage variation across the capacitance C. It can be appreciated that the quick variation of the collector voltage $C_F$ generates a current $I_{CG}$ through the Miller capacitance $C_{GC}$, this current causing a raise in the voltage $V_{GE}$ on the gate terminal A and, as a consequence, an increase of the saturation current $I_C$ of the power device $Q_F$, as shown in FIG. 2.

As a peak value is attained, the collector $C_F$ current $I_C$ goes down, thus causing the collector voltage $V_{CE}$ to overshoot because of parasitic inductances of the Vbus-to-collector $C_F$ path.

The collector $C_F$ voltage $V_{CE}$ will eventually settle at the Vbus value, and the current $I_C$ attains a steady state value given the following relation:

$$I_C = (1+\beta) g_m (V_{GE} - V_{TH}) \quad (2)$$

where: $\beta$ is the current gain of the intrinsic PNP transistor of the device $Q_F$ obtained by means of an IGBT transistor; and $g_m$, $V_{GE}$, and $V_{TH}$ are the transconductance gain, the gate terminal A voltage and the threshold voltage of the intrinsic MOS of the IGBT device, respectively.

Under such conditions, the energy stress undergone by the power device $Q_F$ is augmented by the high peak of current $I_C$, being, in this instance, three times higher than the steady-state value of current in the short-circuit mode.

Tests carried out by the Applicant have shown, with respect to a peak-less transient, an increase of 10 to 15% in energy dissipation and that this percentage can be even higher if considering increasing resistance values.

The waveforms shown in FIG. 3 illustrate the effect of increased resistance $R_G$ of the gate A on the peak of the collector $C_F$ current $I_C$: a higher gate A resistance $R_G$ produces a higher peak of voltage $V_{GE}$, resulting in longer decay time for the gate A voltage $V_{GE}$, until the value of voltage $V_{GE}$ is reached, corresponding to an output voltage of a driving circuit necessary to drive the power device $Q_F$. This causes the voltage $V_{GE}$ of gate A to be more easily affected by variations of the voltage $V_{CE}$ at the collector $C_F$. The result is a further increased value of the gate A voltage $V_{GE}$ and, as a consequence, increased peak of current $I_C$ of collector $C_F$.

In certain applications, for example, to reduce electromagnetic emissions (EMI) from high switching speeds, it is common practice to slow the switchover down by using gate resistances $R_G$ of 100 to 150 Ohms, which force a FUL-faulted power device $Q_F$ to conduct high current peaks (of 250 to 300 A in FIG. 3). In addition, excessive overshooting of the gate A voltage $V_{GE}$ may cause the gate oxide of the power device $Q_F$—which may have been rated for 20 to 40 V—to collapse.

Thus, the aim is that of limiting the current peak that originates, under FUL situation, by means of a suitable protection circuit.

A first prior art solution for limiting the current $I_C$ peak of the collector $C_F$ when in a fault situation—hereinafter also indicated as the "fault current"—is that of using a protection circuit connected between the power device and a driving device, which reduces the gate resistance of the power device.

Shown in FIG. 4 is a circuit configuration for driving power devices $Q_A$ of the type comprising a protection circuit according to the prior art.

In particular, the circuit configuration 1A comprises a first power device $Q_A$ connected between a load and a voltage reference, specifically a ground reference GND. This power device $Q_A$ has a gate terminal $G_A$ connected to an output TA of a driver 2A through a protection circuit 3A.

In the example shown, the driver 2A conventionally comprises the series of two complementary bipolar transistors having their relevant collector terminals connected to the ground reference GND and to a second voltage reference which may be the supply voltage $V_{cc}$. These transistors have their emitter terminals connected together to the output terminal $T_A$ of the driver 2A.

Furthermore, the base terminals of the transistors comprised in the driver 2A are connected together and to the input terminal of the driver 2A itself through an auxiliary resistance.

The protection circuit 3A comprises a resistance $R_{GA}$ connected between the driver 2A and the power device $Q_A$, and comprises a diode D parallel connected with said resistance $R_{GA}$ between the gate terminal $G_A$ of the power device $Q_A$ and the output terminal $T_A$ of the driver 2A.

In order to limit the increase of voltage at the gate terminal $G_A$ of the power device $Q_A$ due to the current $I_{CG}$, the gate terminal impedance between the collector and gate terminals $C_A$ and $G_A$ of the faulted power device $Q_A$ is reduced. The current $I_{CG}$ flowing through the Miller capacitance encounters, along the gate path, less resistance, and therefore, a lower voltage is produced across the resistance $R_{GA}$.

Although advantageous from several points of view, this first solution has several drawbacks.

In particular, to provide the low-impedance path on the resistance $R_{GA}$ in a fault situation, a diode D has to be parallel connected with the gate resistor $R_{GA}$. But the diode D will be operative each time that the power device $Q_A$ is turned off, so that the switching speed of the power device $Q_A$ cannot be controlled by sizing the gate resistance $R_{GA}$.

A second circuit configuration for driving power devices and limit the current $I_C$ peak of the collector $C_F$ due to a fault condition is shown in FIG. 5.

For clarity, elements being identical as for structure and function with respect to the circuit configuration shown in FIG. 4 have been indicated with the same reference numerals and no further described.

In particular, the circuit configuration 1B of FIG. 5 includes a protection circuit 3B between the power device $Q_A$ and a driver 2A that is used for clamping the gate voltage fixing it at 15 V.

The protection circuit 3B comprises a resistance $R_{GA}$ connected between the driver 2A and the power device $Q_A$, and a diode D1 connected between the gate A terminal $G_A$ of the power device $Q_A$ and a voltage reference clamped at 15 V.

As the gate voltage of the power device $Q_A$ begins to rise due to a FUL situation, some of the gate current is diverted off the path that contains the gate resistance $R_{GA}$ through the diode D1, so that the gate voltage is held at 15 V.

A third circuit configuration for driving power devices, which is effective to limit the fault current, is shown in FIG. 6.

In particular, the circuit configuration 1C of FIG. 6 includes a protection circuit 3C between the power device $Q_A$ and a driver 2A that is used for clamping the gate voltage.

The protection circuit 3C comprises a gate resistance $R_{GA}$ connected between the driver 2A and the power device $Q_A$, and a series of a diode D2 and a Zener diode D3 connected between the gate terminal $G_A$ and a ground reference GND.

As the gate voltage of the power device $Q_A$ begins to rise due to a FUL situation, some of the gate current is diverted off the path that contains the resistance $R_{GA}$ through the series of diodes D2 and D3, so that the gate voltage is set by the inverse voltage of the Zener diode D3, which is selected higher than the drive voltage value of the gate terminal $G_A$ in a normal operation condition.

While achieving their objectives, also these two prior art solutions acting to clamp the gate voltage have drawbacks.

In fact both protection circuits 3B and 3C of FIGS. 5 and 6 will clamp the value of the gate voltage $V_{GE}$ on the occurrence of a fault. In this way, although limiting the dynamic increase of the gate voltage and hence of the fault current, these circuits reduce the overall effectiveness of the protection device.

There is a need for a protection device effective to limit the leakage currents through the circuit on the occurrence of a fault, which would ensure reliable operation under all conditions. Such a device typically has appropriate structural and functional features so as to leave the switching dynamics unaffected, and in this way overcome the limitations of prior art circuits.

SUMMARY

According to an embodiment of the present invention, a circuit protects the dynamic current of power devices such as IGBTs, with the circuit selectively operating only upon the gate voltage increase under FUL conditions.

According to this embodiment a protection circuit is provided for a control terminal of a power device of the type comprising at least one resistive element connected between at least one output terminal of a driver and said control terminal of said power device, and being characterized in that it further comprises at least one turn-off transistor having its conduction terminals respectively connected to said control terminal of said power device and to said at least one output terminal of said driver, as well as a control terminal coupled to said control terminal of said power device through a second resistive element.

BRIEF DESCRIPTION OF THE DRAWINGS

Features and advantages of the device of this invention should become apparent from the following description of an embodiment thereof, given by way of non-limitative examples with reference to the accompanying drawings.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 7:
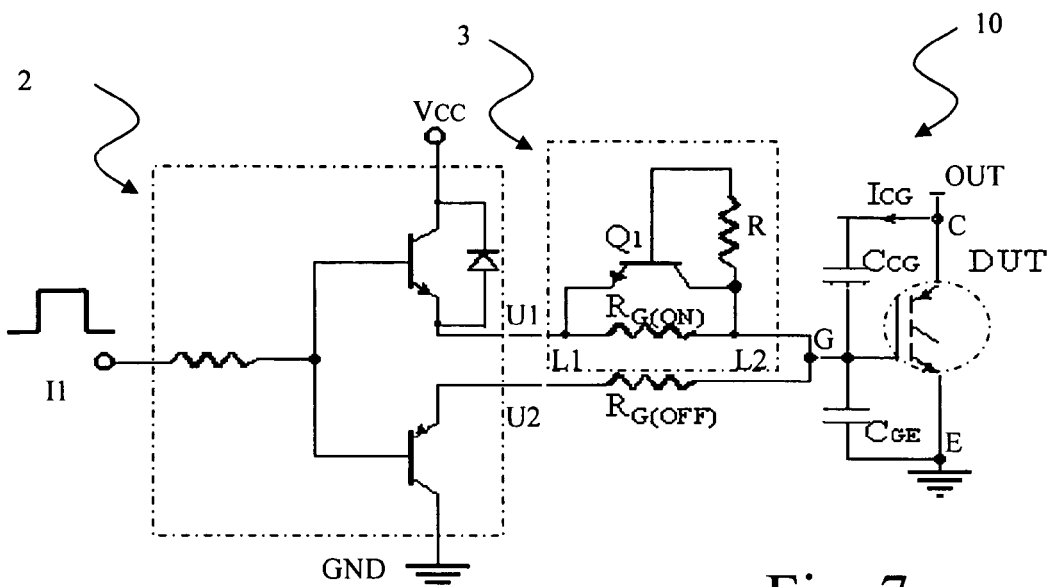
FIG. 7 is a diagram of a circuit configuration for driving power devices, according to an embodiment of the invention.

With reference to FIG. 7, a circuit configuration comprising a protection circuit of a control terminal of a power device under FUL condition is schematically and generally shown with 10.

The circuit configuration 10 comprises a DUT (Device Under Test) power device connected between a first output OUT of the DUT and a voltage reference, in particular a ground reference GND, and having a control terminal, in particular a gate terminal G, connected to a driver 2.

This DUT power device also has a first capacitance $C_{CG}$, or Miller capacitance, connected between the collector terminal C and the gate terminal G, and a second capacitance $C_{GE}$ connected between the emitter terminal E and the gate terminal G.

The driver 2 has a first driving output U1 connected to the gate terminal G through a protection circuit 3, as well as a second driving output U2 always connected to the gate terminal G through a first resistive element $R_{G(OFF)}$.

In one embodiment, the driver 2 conventionally comprises two complementary bipolar transistors having their collector terminals connected to the ground reference GND and to a second voltage reference, in particular the supply voltage $V_{CC}$. The emitter terminals of both bipolar transistors are connected to the relevant output terminals U1 and U2 of the driver 2.

Moreover, the base terminals of the two bipolar transistors are connected together and to an input terminal of the driver 2 through an auxiliary resistor.

Advantageously in this embodiment, the protection circuit 3 has an input terminal L1 and an output terminal L2 respectively connected to the output U1 of the driver 2 and the gate terminal G of the DUT power device.

The protection circuit 3 comprises a second resistive element $R_{G(ON)}$ being connected between its input terminal L1 and its output terminal L2. Moreover, the protection circuit 3 comprises a turn-off transistor Q1 element having its conduction terminals connected to the input terminal L1 and the output terminal L2 of the protection circuit 3, and accordingly placed in parallel with the second resistive element $R_{G(ON)}$.

Advantageously, the transistor Q1 element is a bipolar transistor.

The control terminal of the turn-off transistor Q1 is connected, through a third resistive element R, to the collector terminal of transistor Q1, and therefore to the output terminal L2 of the protection circuit 3.

In particular, the turn-off transistor Q1 may attained by means of a PNP transistor or a P-channel MOS transistor.

The operation of the protection circuit 3 of this embodiment, intended for limiting the collector current peak on the occurrence of a FUL situation, will now be described.

On the occurrence of a short-circuit, transistor $Q_1$ is biased, through the third resistive element R, by the sharp change of the gate voltage $V_{GE}$ brought about by a sharp change of the collector voltage $V_{CG}$ across the Miller capacitance $C_{CG}$, causing a short-circuit of the second resistive element $R_{G(ON)}$. As a result, a parasitic current $I_{CG}$ is offered a low-impedance path, thus limiting the voltage peak on the gate terminal G and as a consequence the current peak at the collector terminal C. Advantageously in this embodiment, the protection circuit 3 will only become operative in a fault situation, and stand by in normal operation.

Advantageously, the switching speed of the DUT device may be designed by suitably dimensioning the first and second resistive elements $R_{G(ON)}$–$R_{G(OFF)}$, which can typically have different resistances.

This first embodiment of the protection circuit 3 of the invention is advantageously with driving circuits 2 having two separate outputs for turning on and off.

Figure 8:
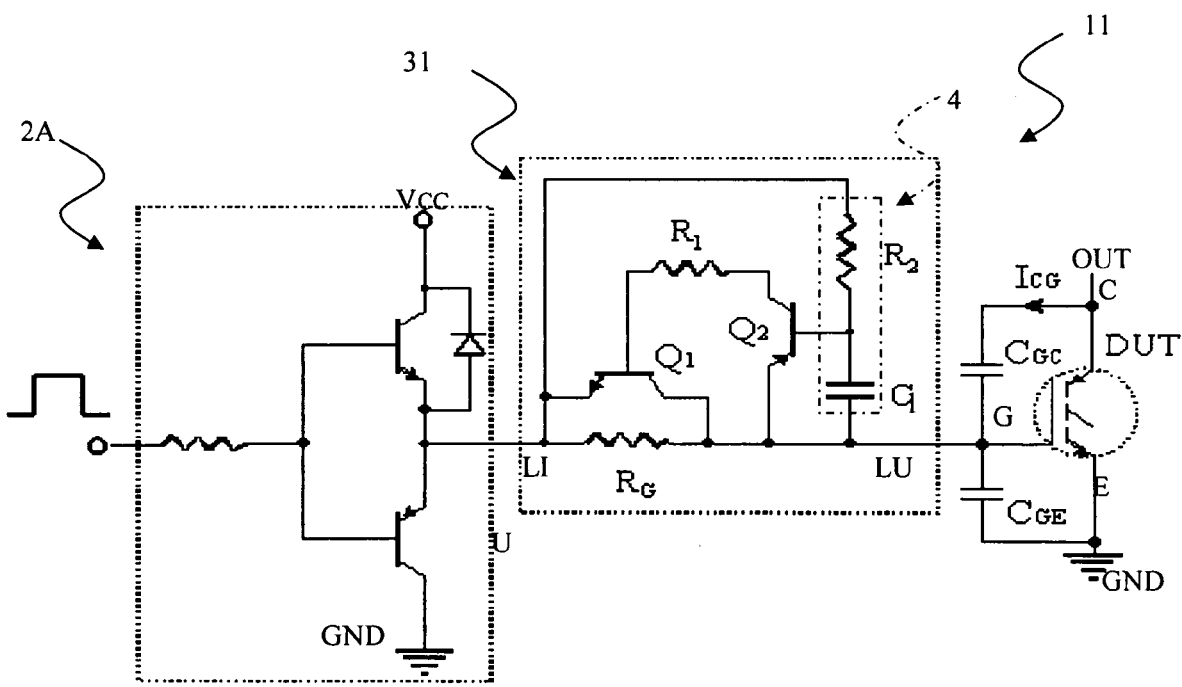
FIG. 8 is a diagram of a modification of the circuit configuration of FIG. 7 for driving power devices according to an embodiment of the invention.

A second embodiment of a protection circuit 3A, intended for being used with driving circuits 2A having a single output is shown as 31 in FIG. 8.

The circuit configuration 11 comprises a DUT power device, which is connected between a first output OUT and a voltage reference, in particular a ground reference GND, and has a control terminal, in particular a gate terminal G, connected to an output of a driver 2A. This DUT power device has a first or Miller capacitance $C_{CG}$ connected between the collector terminal C and the gate terminal G, and has a second capacitance $C_{CG}$ connected between the emitter terminal E and the gate terminal G.

The driver 2A has a driving output U connected to the gate terminal G through a protection circuit 31.

Advantageously in this embodiment, the protection circuit 31 has an input terminal LI and an output terminal LU connected to the output U of the driver 2A and the gate terminal G of the DUT power device, respectively.

The protection circuit 31 comprises a first resistive element $R_G$ connected between its input terminal LI and output terminal LU. The protection circuit 31 additionally comprises a turn-off transistor Q1 having its conduction terminals connected to the input terminal LI and the output terminal LU of the protection circuit 31, and therefore placed in parallel with the first resistive element $R_G$.

Advantageously, the turn-off transistor Q1 is a bipolar transistor.

The protection circuit 31 further comprises a second transistor Q2 having its conduction terminals connected to the control terminal of transistor Q1 through a second resistive element R1 and directly connected to the output terminal LU of the protection circuit 31.

Advantageously, the transistor Q2 is a bipolar transistor.

In particular, the transistors Q1, Q2 may be attained by means of NPN or PNP transistors or N- or P-channel MOS transistors.

A bias network 4 of transistor Q2 extends between the terminal LI and the output terminal LU of the protection circuit 31.

In particular, the bias network 4 includes a third resistive element R2 connected between the input terminal LI of the protection circuit 31 and the control terminal of the second transistor Q2, and includes a capacitive element $C_1$ connected between the output terminal LU of the protection circuit 31 and the control terminal of the second transistor Q2.

The operation of the protection circuit 31 is described here below.

As in the previously described embodiment, in the event of a short-circuit the transistor $Q_1$ is biased through the second resistive element $R_1$ by a sharp change in the collector voltage $V_{CE}$ across the Miller capacitance $C_{CG}$, thus causing a short-circuit of the first resistive element $R_G$. As a result, a parasitic current $I_{CG}$ is offered a low-impedance path, thus limiting the voltage peak on the gate terminal G, and as a consequence the current peak of the collector terminal C.

Transistor $Q_2$ acts as a guardian transistor, and enables transistor $Q_1$ only on the occurrence of a FUL situation.

In particular, by suitably dimensioning the bias network 4, transistor $Q_1$ is disabled during normal operation, when the DUT power device is driven only through the resistive element $R_G$.

Figure 9:
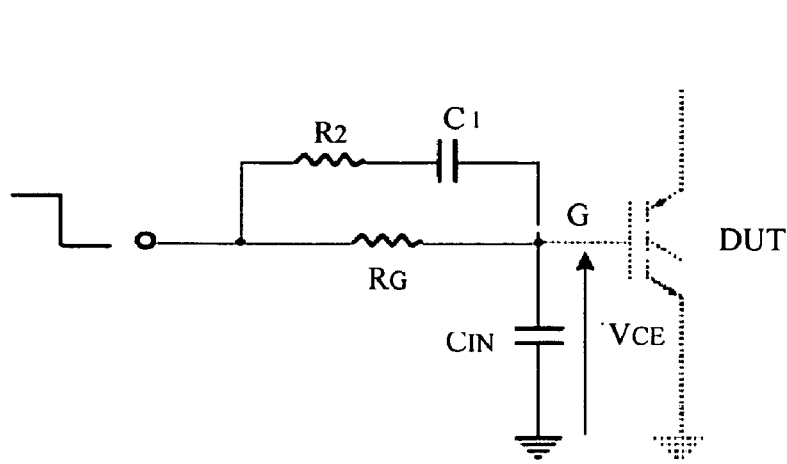
FIG. 9 is a diagram of a first circuit for dimensioning the circuit configuration for driving power devices shown in FIG. 8 according to an embodiment of the invention.
Figure 10:
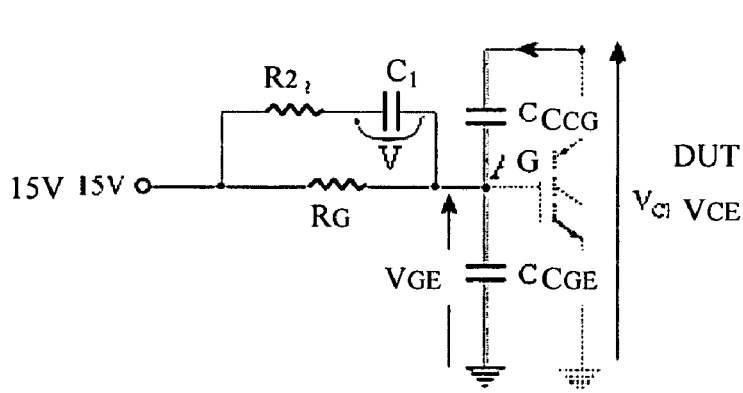
FIG. 10 is a diagram of a second circuit for dimensioning the circuit configuration for driving power devices shown in FIG. 8 according to an embodiment of the invention.

The capacitive element $C_1$ and resistive element $R_2$ can be dimensioned considering the equivalent circuits shown in FIGS. 9 and 10 and relating to the protection circuit 31 being operated under the turned-off and FUL conditions, respectively.

In particular, as is evident from the equivalent diagram of FIG. 9, the value of the third resistive element $R_2$, which allows disablement of the guard of transistor $Q_2$, during the turn-off, can be obtained. For the purpose, the capacitive element $C_1$ needs to have a sufficiently high value, higher than the input capacitance $C_{IN}$ of the DUT power device, so that the time constant at the input of transistor $Q_2$ is increased and so that the transistor is turned-on after a longer duration.

Because of this high capacitance on the gate terminal G of the DUT power device, its input time constant, i.e., the time constant at the gate terminal G (normally $\tau = R_G * C_{IN}$), grows excessively, causing the working frequency of the DUT power device to drop. This drop of the working frequency may also cause malfunction of the mechanism that limits the FUL current.

To increase the working frequency, the value of the resistive element $R_2$ is dimensioned so that the time constant at the input of the DUT power device stays almost constant and equal to $\tau = R_G * C_{IN}$.

With reference to the equivalent diagram of FIG. 9, the input time constant of the DUT power device can be determined, once the components $R_2$ and $C_1$ are taken into account. It should be noted that, since a high capacitance has been assumed for the capacitive element $C_1$, transistor $Q_2$ cannot be turned on, and, as a consequence, gate impedance stays equal to that of the resistive element $R_G$, as shown in FIG. 9.

During the turning-off step it is possible to reach, through simple steps, to the following relation:

$$\frac{V_{GE}}{R_G} + sC_{IN}V_{GE} + \frac{sC}{1+sR_2C_1}V_{GE} = 0 \qquad (3)$$

where $V_{GE}$ is the voltage between the gate and emitter terminals of the power device.

In particular, relation (3) is achieved by applying Kirchoff's law to the gate node G and then passing it to the Laplace transform.

Assuming that capacitance $C_{IN}$ is much smaller than $C_1$, after some steps, a time constant can be determined as follows:

$$\tau' = R_2 // R_G \cdot C_{IN} \qquad (4)$$

The same result can be obtained, observing that, if in the circuit of FIG. 9 the capacitor $C_1$ is very large, resistive element $R_2$ is in parallel with resistive element $R_G$ and with $C_{IN}$. This time constant controls the turn-on/off switchings and, from relation (4) it appears that, if resistive element $R_2$ is selected of a much higher value than resistive element $R_G$, time constant $\tau'$ would approach the time constant of the gate circuit when no protection circuit is provided, i.e. $\tau = R_G * C_{IN}$.

However, a very large resistive element $R_2$ would significantly delay activation of the protection circuit in a FUL situation, so that it is desired for time constant $\tau'$ to differ somewhat from $\tau$, e.g. by 10%. Therefore, time constant $\tau'$ will be $0.9\tau$, and resistive element $R_2$ given by:

$$R_2 = 10 \cdot R_G \qquad (5)$$

The problem of the input time constant of the DUT power device varying during normal switching is thus overcome.

As for the dimensioning of the capacitive element $C_1$ in order to improve effectiveness of the protection circuit in a FUL situation can be improved. For the protection circuit to operate quickly in a FUL situation, transistor $Q_2$ is turned on quickly. This means that the value of the capacitive element $C_1$ should be as low as possible. But, as said before, this clashes with the need to have an input time constant of the DUT power device almost unchanged.

Therefore, a limit is found, being higher than the capacitive element $C_1$ value so as to attain a compromise between the above extremes.

For this purpose, consider the circuit of FIG. 10 illustrating the operation of the protection circuit 31 upon occurrence of a fault situation. In normal operation, the voltage across the capacitive element $C_1$ is void and so transistor $Q_2$ stays off. On the occurrence of a short-circuit, the rapid voltage variation on the collector of the DUT power device would generate through the capacitance $C_{GC}$ a current equal to:

$$I_{CG} = C_{GC}\frac{dV_{CE}}{dt}$$

that will reach node G in FIG. 10. Lacking the protection circuit 31, this current would reach the gate resistance and the gate-emitter capacitance, causing the gate voltage to overshoot. On the other hand, with the circuit 31, this current also charges the capacitive element $C_1$ and produces a voltage variation across it. For transistor $Q_2$ to be on, the emitter-base voltage $V_{eb}$ of transistor $Q_2$ must be exceeded. Accordingly, the greater the voltage variation across the capacitive element $C_1$ the smaller becomes the turning-on time of transistor $Q_2$ and the more efficient the fault current reducing mechanism.

The upper limit of the capacitive element $C_1$, above which the protection circuit 31 is ineffective, can be expressed mathematically. Thus, by Laplace transforms, current $I_{CG}$ can be written as:

$$I_{CG}(s) = sC_{GC}V_{CE}(s) \quad (6)$$

Since the objective is to have as much current as possible being charged on the capacitive element $C_1$, the following would be the best relation:

$$sCV(s) \cong sC_{GC}V_{CE}(s) \quad (7)$$

The above relation should be understood as one of less than/equal to, because the current through the capacitive element $C_1$ would be a fraction of current $I_{CG}$. In the time domain, it is:

$$V \cong \frac{C_{GC}}{C_1} V_{CE} \quad (8)$$

But the voltage variation across the capacitive element $C_1$ should exceed $V_{eb}$ of transistor $Q_2$. Therefore:

$$C \leq C_{GC} \frac{\Delta V_{CE}}{V_{eb}} \quad (9)$$

The capacitive element $C_1$ depends, according to relation (9), on the parasitic gate-collector capacitance, as well as on the voltage variation forced on the collector node and on the emitter-base voltage of transistor $Q_2$. The relation allows the following considerations. The larger the voltage variation forced on the collector is, and the larger the gate-collector capacitance is, the larger becomes the capacitance $C_1$, coming from relation (9), thus fulfilling the above requirement of input time constant of the DUT power device. For a given capacitance C, a shorter charging time, and accordingly faster turn-on for transistor $Q_2$, are obtained, resulting in improved fault-current limitation as the collector voltage and the parasitic gate-collector variation increases.

Figure 11:
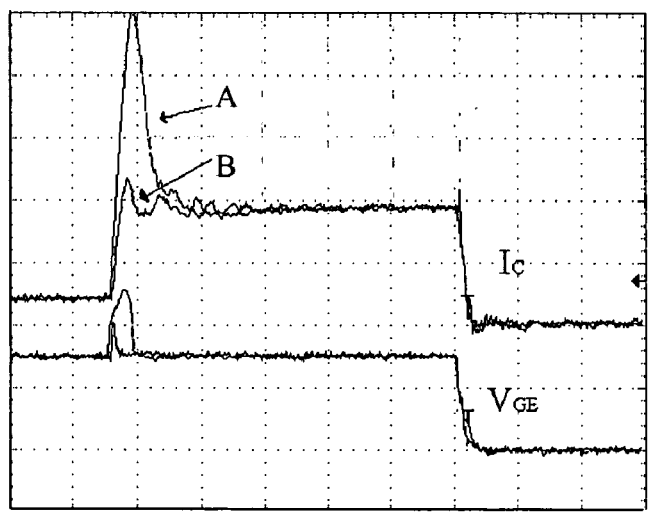
FIG. 11 schematically shows the compared pattern of voltage and current signals inside a power device being connected or not in the driving circuit configuration of the above-described embodiments of the invention.

Tests have been carried out on short-circuit robust (20A, 600V) IGBT devices. The values of the resistive element $R_2$ and of the capacitance C1 were calculated from relations (5) and (9) for the protection circuit and used in the tests. These gave $R_2$=1.5 kΩ and C=8 nF. Shown in FIG. 11 are a first waveform A showing the pattern of the collector C current $I_C$ in a FUL situation without the protection circuit 31 (FIG. 8), and a waveform B showing the collector C current $I_C$ in a FUL situation with the protection circuit 31. A comparison of these waveforms reveals marked attenuation of the peak of the collector current $I_C$, as brought about by the protection circuit 31 limiting the peak in the voltage $V_{CG}$ on the gate G. Further, notice that when turning off the DUT device the typical problem of a conventional circuit such as that of FIG. 4 is here removed.

Figure 1:
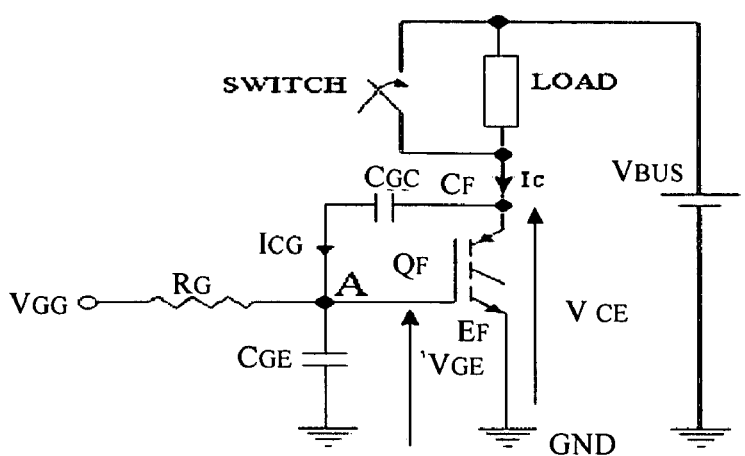
FIG. 1 is a circuit diagram for detecting a fault condition for a power device, according to the prior art.
Figure 2:
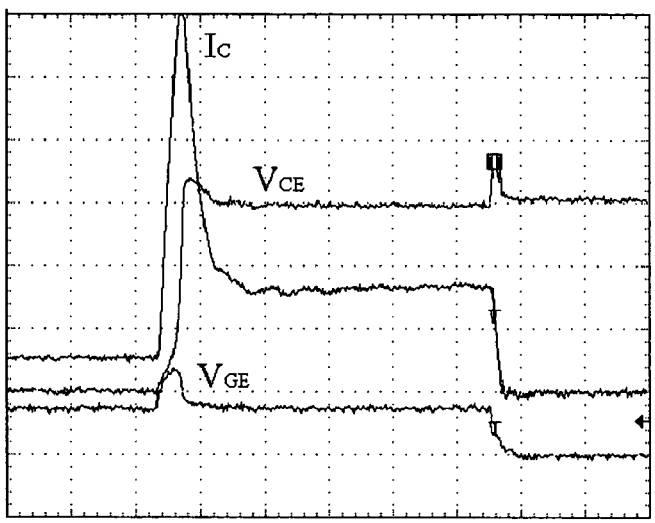
FIG. 2 schematically shows the pattern of voltage and current signals inside the power device of FIG. 1.
Figure 3:
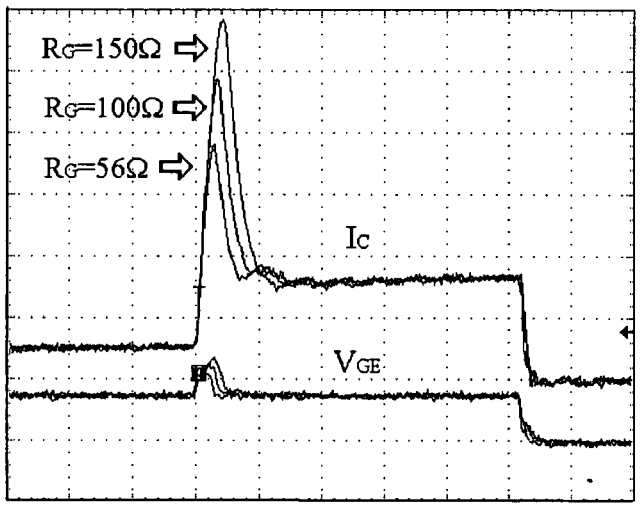
FIG. 3 schematically shows the behavior of current signals as the gate resistance of the power device of FIG. 1 varies.
Figure 4:
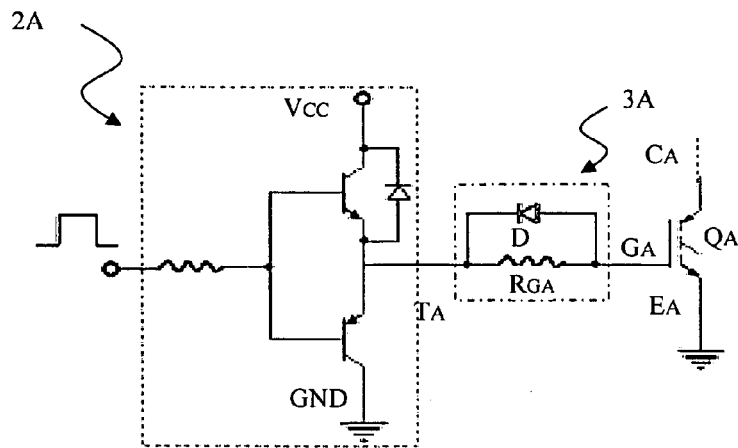
FIG. 4 is a diagram of a first circuit configuration for driving power devices, according to the prior art.
Figure 5:
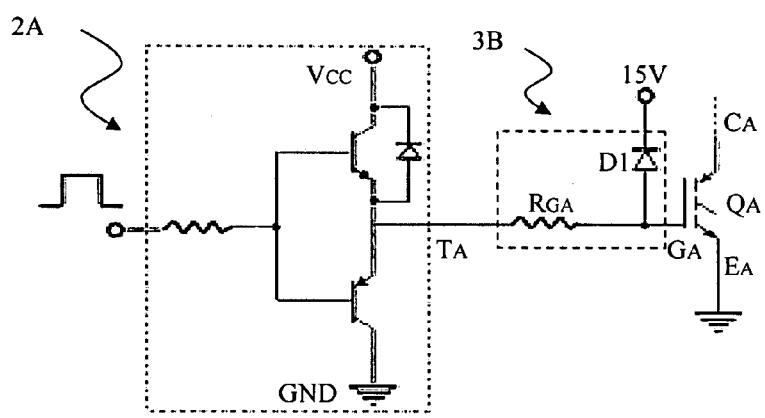
FIG. 5 is a diagram of a second circuit configuration for driving power devices, according to the prior art.
Figure 6:
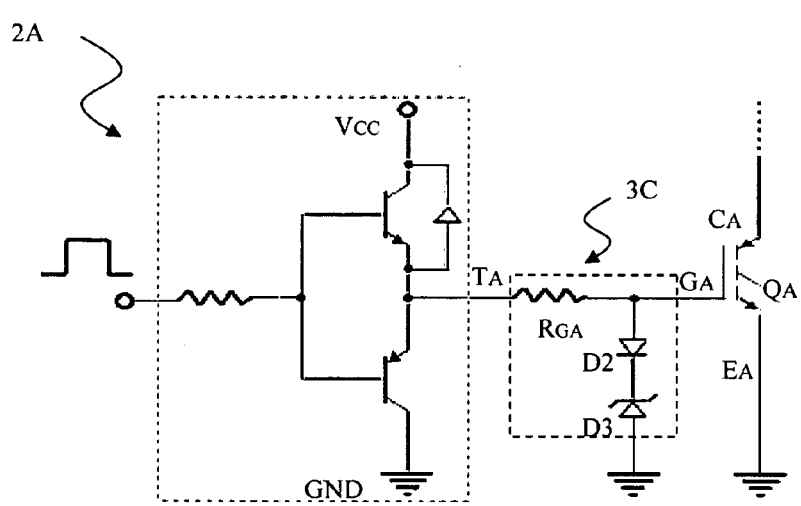
FIG. 6 is a diagram of a third circuit configuration for driving power devices, according to the prior art.

In particular, whereas the diode of circuit 3A in FIG. 4 would conduct at each turn-off, in the circuit 31 of FIG. 8, the guardian transistor $Q_2$ would activate transistor $Q_1$ only on the occurrence of a FUL. A comparison of the waveforms of the two gate voltages without and with the protection circuit shows a slight variation in the voltage tail due to the above-discussed variation of the input time constant of the DUT power device brought about by the protection circuit.

By using this protection device, the stress undergone by the power device when under short-circuit condition can be attenuated. In addition, the protection device will typically prevent the gate oxide of the power device from collapsing under the above overvoltage.

To summarize, the protection circuits 3, 31 and of FIGS. 7 and 8 are effective to reduce the current peak that occurs in power devices, such as IGBTs, in a fault-under-load (FUL) situation by limiting the voltage increase of the control terminal, but without affecting normal operation. These protection circuits may be used in applications where driving circuits with one and/or two outputs (for turning on/off) are employed, and are particularly simple, since they are based on the control of the gate voltage and make monitoring the collector voltage or current unnecessary.

Thus, the protection circuits 3, 31 reduce the amount of stress to which power devices, in particular IGBTs, are subject on the occurrence of short-circuits, reducing the gate voltage peak so that the oxide is prevented from collapsing, and protecting short-circuit vulnerable power devices against latch-ups.

Further, the control terminal voltage is held at a normal working level even as a fault occurs, and no elevated voltage is required for limiting the gate voltage peak, as was instead necessary in the prior art.

The circuits 10 and 11 of FIGS. 7 and 8 may be incorporated into an integrated circuit, which may be incorporated into an electronic system such as an automobile. In some applications, however, the power device may be external to such an integrated circuit.

From the foregoing it will be appreciated that, although specific embodiments of the invention have been described herein for purposes of illustration, various modifications may be made without deviating from the spirit and scope of the invention.

The invention claimed is:

1. A protection circuit for a control terminal of a power device comprising at least one resistive element connected between at least one output terminal of a driver and the control terminal of the power device, wherein the protection circuit further comprises at least one turn-off transistor having conduction terminals connected to the control terminal of the power device and to each of the output terminals of the driver respectively, the turn-off transistor further including a control terminal coupled to the control terminal of the power device through a second resistive element.

2. A protection circuit according to claim 1, wherein the protection circuit further comprises a third resistive element connected between the control terminal of the power device and a second output terminal of a driver.

3. A protection circuit according to claim 1, wherein the protection circuit further comprises a second transistor whose conduction terminals are connected between the second resistive element and the control terminal of the power device.

4. A protection circuit according to claim 3, wherein the protection circuit further comprises a bias network of the second transistor, the bias network including in turn a fourth resistive element connected between the at least one output terminal of the driver and a control terminal of the second transistor, as well as a capacitive element connected between the control terminal of the second transistor and the control terminal of the power device.

5. A protection circuit according to claim 1, wherein the turn-off transistor comprises an NPN transistor.

6. A protection circuit according to claim 3, wherein the transistor comprises a PNP transistor.

7. A protection circuit according to claim 1, wherein the turn-off transistor comprises an N-channel MOS transistor.

8. A protection circuit according to claim 3, wherein the transistor comprises a P-channel MOS transistor.

9. A protection circuit according to claim 1, wherein the power device comprises an IGBT type of transistor.

10. A protection circuit according to claim 1, wherein the power device comprises a MOS type of power transistor.

11. A circuit configuration for driving a power device being connected between an output and a voltage reference and having a control terminal connected to at least one output of a driver through a protection circuit the protection circuit being connected between the at least one output and the control terminal of the power device; wherein the protection circuit is the protection circuit of claim 1.

12. An electronic control system, comprising:
a power device including a control terminal and operable to be selectively activated responsive to a control signal on the control terminal;
a driver adapted to receive an input signal and having an output, the driver being operable to develop an output signal on the output responsive to the input signal; and
a protection circuit coupled to the output of the driver and the control terminal of the power device, the protection circuit including
an impedance element coupled between the output of the driver and the control terminal of the power device; and
a fault circuit coupled between the output of the driver and the control terminal of the power device, the fault circuit operable in a normal mode to present the impedance between the output of the driver and the control terminal of the power device, and operable in a fault mode to limit a voltage developed on the control terminal of the power device; and
wherein the impedance element comprises a resistor; and wherein the fault circuit comprises,
a switching circuit having control terminals coupled in parallel with the resistor and having a control terminal, and
a second impedance element coupled to the control terminal of the switching
circuit and to the control terminal of the power device.

13. The electronic control system of claim 12 wherein the switching circuit comprises a transistor.

14. The electronic control system of claim 12 wherein the second impedance element comprises a resistor.

15. The electronic control system of claim 12 wherein the power device comprises an IGBT.

16. The electronic control system of claim 12
wherein the resistive element comprises a single resistor; and
wherein the fault circuit comprises,
a first switching circuit having control terminals coupled in parallel with the resistor and having a control terminal,
a biasing circuit coupled between the control terminal of the power device and the output of the driver,
a second switching circuit having a first signal terminal coupled to the control terminal of the power device and a second signal terminal, and having a control terminal coupled to the biasing circuit, and
a second impedance element coupled to the control terminal of the first switching circuit and the second signal terminal of the second switching circuit.

17. The electronic control system of claim 16 wherein the first and second switching circuits comprise transistors.

18. The electronic control system of claim 17 wherein the biasing circuit comprises a capacitor and impedance element coupled in series, and wherein the control terminal of the second switching circuit is coupled to a node defined by the interconnection of a terminal of the capacitor and a terminal of the impedance element.

19. The electronic control system of claim 18 wherein the impedance element comprises a resistor.

20. The electronic control system of claim 19 wherein the power device comprises an IGBT.

21. An electronic system including an integrated circuit, the integrated circuit comprising:
a protection circuit having a first terminal adapted to receive an output drive signal and having a second terminal adapted to receive a power control signal, the protection circuit including,
a first resistive element coupled between the first and second terminals; and
a fault circuit coupled in parallel with the first resistive element, the fault circuit operable in a normal mode to present the first resistive element between the first and second terminals and operable in a fault mode to limit a voltage developed on the second terminal; and the fault circuit further including a second resistive element coupled between the second terminal and a control terminal of the fault circuit.

22. The electronic system of claim 21 wherein the electronic system comprises an automotive electronic system for an automobile.

23. A method of protecting a power device having a control terminal being driven through a first resistive element by a driver circuit, the method comprising:
during a normal mode of operation, driving the power device through the first resistive element; and
detecting a fault mode of operation responsive to a voltage developed on the control terminal and applied through a second resistive element; and
upon detection of the fault mode of operation, reducing a resistance of the first resistive element to limit a voltage developed on the control terminal without affecting the first resistive element during normal operation.

24. The method of claim 23 wherein the fault mode of operation corresponds to an FUL condition.

25. The method of claim 23 wherein detecting the fault mode of operation comprises generating a bias voltage responsive to the voltage on the control terminal and detecting the fault mode responsive to the voltage being greater than a threshold value.

* * * * *